(12) United States Patent
Chang et al.

(10) Patent No.: US 7,960,773 B2
(45) Date of Patent: Jun. 14, 2011

(54) CAPACITOR DEVICE AND METHOD FOR MANUFACTURING THE SAME

(75) Inventors: Shu-Ming Chang, Taipei County (TW); Chia-Wen Chiang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 52 days.

(21) Appl. No.: 12/364,543

(22) Filed: Feb. 3, 2009

(65) Prior Publication Data

US 2010/0052099 A1   Mar. 4, 2010

(30) Foreign Application Priority Data

Aug. 29, 2008   (TW) .............................. 97133268 A

(51) Int. Cl.
*H01L 51/05* (2006.01)
(52) U.S. Cl. ........ 257/307; 257/308; 257/532; 257/534; 257/E27.034; 257/E27.048; 257/E29.346; 257/E23.057

(58) Field of Classification Search .................. 257/307, 257/308
See application file for complete search history.

(56) References Cited

U.S. PATENT DOCUMENTS

| | | | |
|---|---|---|---|
| 4,409,608 A * | 10/1983 | Yoder ........................... 257/534 |
| 5,150,276 A | 9/1992 | Gonzalez et al. |
| 5,393,373 A | 2/1995 | Jun et al. |
| 6,552,383 B2 | 4/2003 | Ahn et al. |
| 6,740,922 B2 | 5/2004 | Jones et al. |
| 6,812,109 B2 | 11/2004 | Ahn et al. |
| 2001/0020725 A1 * | 9/2001 | Okuno et al. .................. 257/410 |

* cited by examiner

*Primary Examiner* — Minh-Loan T Tran
*Assistant Examiner* — Fei Fei Yeung Lopez
(74) *Attorney, Agent, or Firm* — Birch, Stewart, Kolasch & Birch, LLP

(57) ABSTRACT

This invention provides a capacitor device with a high dielectric constant material and multiple vertical electrode plates. The capacitor devices can be directly fabricated on a wafer with low temperature processes so as to be integrated with active devices formed on the wafer. This invention also forms vertical conducting lines in the capacitor devices using the through-silicon-via technology to facilitate the three-dimensional stacking of the capacitor devices.

7 Claims, 10 Drawing Sheets

CAPACITOR DEVICE AND METHOD FOR MANUFACTURING THE SAME

BACKGROUND OF THE INVENTION

1. Field of the Invention

The present invention relates to a capacitor device, and more particularly, to a capacitor device fabricated using a wafer-level process.

2. Description of the Related Art

Operating IC devices generally requires coupling capacitors to effectively reduce noise. A capacitor that is closer to the IC device will have a lower parasitic inductance and better electrical performance accordingly. Conventional capacitor types include surface mounting device type capacitors, film capacitors and trench capacitors. A conventional surface mount capacitor 1, as shown in FIG. 1, achieves high capacitance by employing multiple layers. The capacitor 1 is formed by printing an electrode 12 on a dielectric layer 10 using thick film printing techniques first and then undergoing the stacking and sintering processes, wherein the sintering temperature is generally more than 1000° C. Although the multi-layered structure results in a high capacitance, the surface mount capacitor 1 needs to be further assembled to a substrate 20, as shown in FIG. 2. Moreover, a substrate 20 is located between the decoupling capacitor 1 and the IC device 22. Besides, as there are greater demands for more compact portable electronic devices, sizes of electronic packages are minimizing, too. As such, the size of a surface mount capacitor 1 is also becoming smaller.

It is known that film capacitors are fabricated using thin-film processing techniques, and the capacitance is improved by reducing the thickness of dielectric layers. The fabrication process can integrate with IC fabrication processes, but the capacitance density per unit area is still limited. Therefore, achieving high capacitance density by utilizing multi-layer structures will increase mask numbers. Trench capacitors are fabricated by forming trenches with close, small spacing on the silicon wafer; thin layer of dielectric material is deposited in the trenches to have high capacitance density.

SUMMARY OF THE INVENTION

A capacitor device of the present invention comprises a semiconductor substrate having at least one active device and at least one capacitor device comprising a bulk dielectric material, a plurality of first electrode plates, a first common conducting line, a plurality of second electrode plates, and a second common conducting line. The capacitor device is formed in a predetermined region of the semiconductor substrate, and the bulk dielectric material is positioned in the predetermined region of the semiconductor substrate. The plurality of first electrode plates extend vertically from one surface of the semiconductor substrate into the bulk dielectric material, and each first electrode plate is disposed parallel to one another. The first common conducting line is formed on the surface of the semiconductor substrate and electrically connects the first electrode plates. The plurality of second electrode plates extends vertically from the surface of the semiconductor substrate into the bulk dielectric material and interdigitate parallel to the first electrode plates. The second common conducting line is formed opposite to the first common conducting line on the surface of the semiconductor substrate and electrically connects the second electrode plates.

The present invention also provides a method for manufacturing a capacitor device, which comprises: providing a semiconductor substrate having at least one active device; forming at least one cavity at a predetermined region of the semiconductor substrate; filling the cavity with a bulk dielectric material; forming a plurality of parallel plate-shaped holes extending vertically through the bulk dielectric material; and forming a plurality of electrode plates within the plate-shaped holes and forming a conducting line pattern on a surface of the semiconductor substrate at the same time, wherein the electrode plates include a first set of electrode plates and a second set of electrode plates disposed interdigitatedly; the conducting line pattern includes a first common conducting line connecting the first set of electrode plates, a second common conducting line connecting the second set of electrode plates, a first parallel conducting line connecting with the electrode plate which is closest to the outside among the first set of electrode plates, and a second parallel conducting line connecting with the electrode plate which is closest to the outside among the second set of electrode plates.

The present invention further provides a method for manufacturing a capacitor device, which comprises: providing a semiconductor substrate having at least one active device; forming at least one cavity at a predetermined region of the semiconductor substrate; filling the cavity with a bulk dielectric material; forming a plurality of first plate-shaped holes, which are disposed parallel to one another and extending vertically through the bulk dielectric material; forming a plurality of first electrode plates within the first plate-shaped holes; forming a plurality of second plate-shaped holes, which are disposed parallel to one another, extending vertically through the bulk dielectric material, and interdigitating with the first electrode plates; and forming a plurality of second electrode plates within the second plate-shaped holes and forming a conducting line pattern on a surface of the semiconductor substrate at the same time, wherein the conducting line pattern includes a first common conducting line connecting the first electrode plates, a second common conducting line connecting the second electrode plates, a first parallel conducting line connecting with the first electrode plate closest to the outside, and a second parallel conducting line connecting with the second electrode plate closest to the outside.

DETAILED DESCRIPTION OF THE PREFERRED EMBODIMENTS

Figure 1:
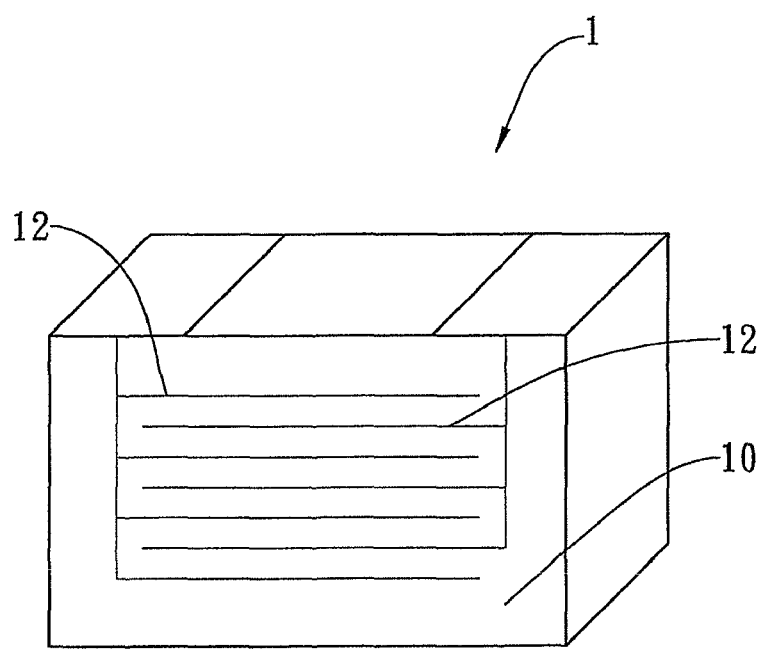
FIG. 1 is a schematic perspective view illustrating a conventional surface mount capacitor device.
Figure 2:
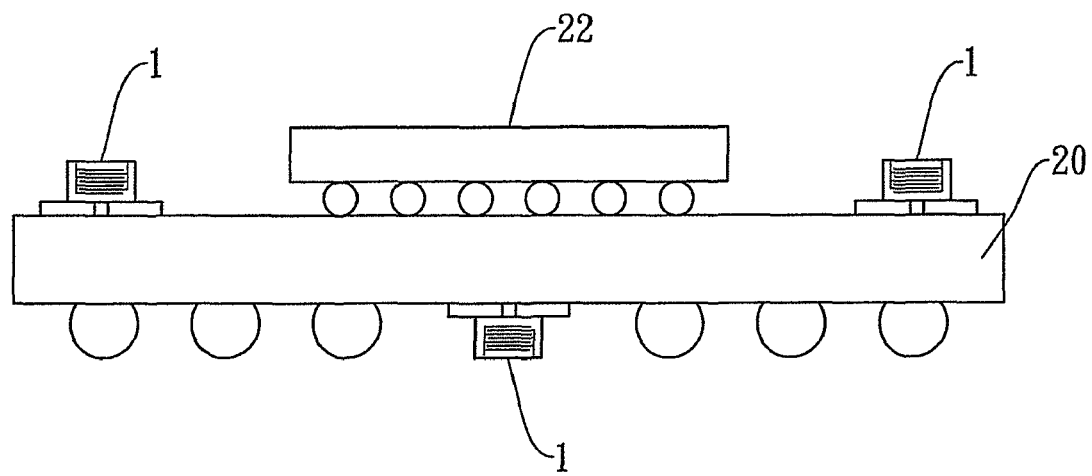
FIG. 2 is a schematic side view illustrating a wafer assembled with the surface mount capacitor devices in FIG. 1.
Figure 3:
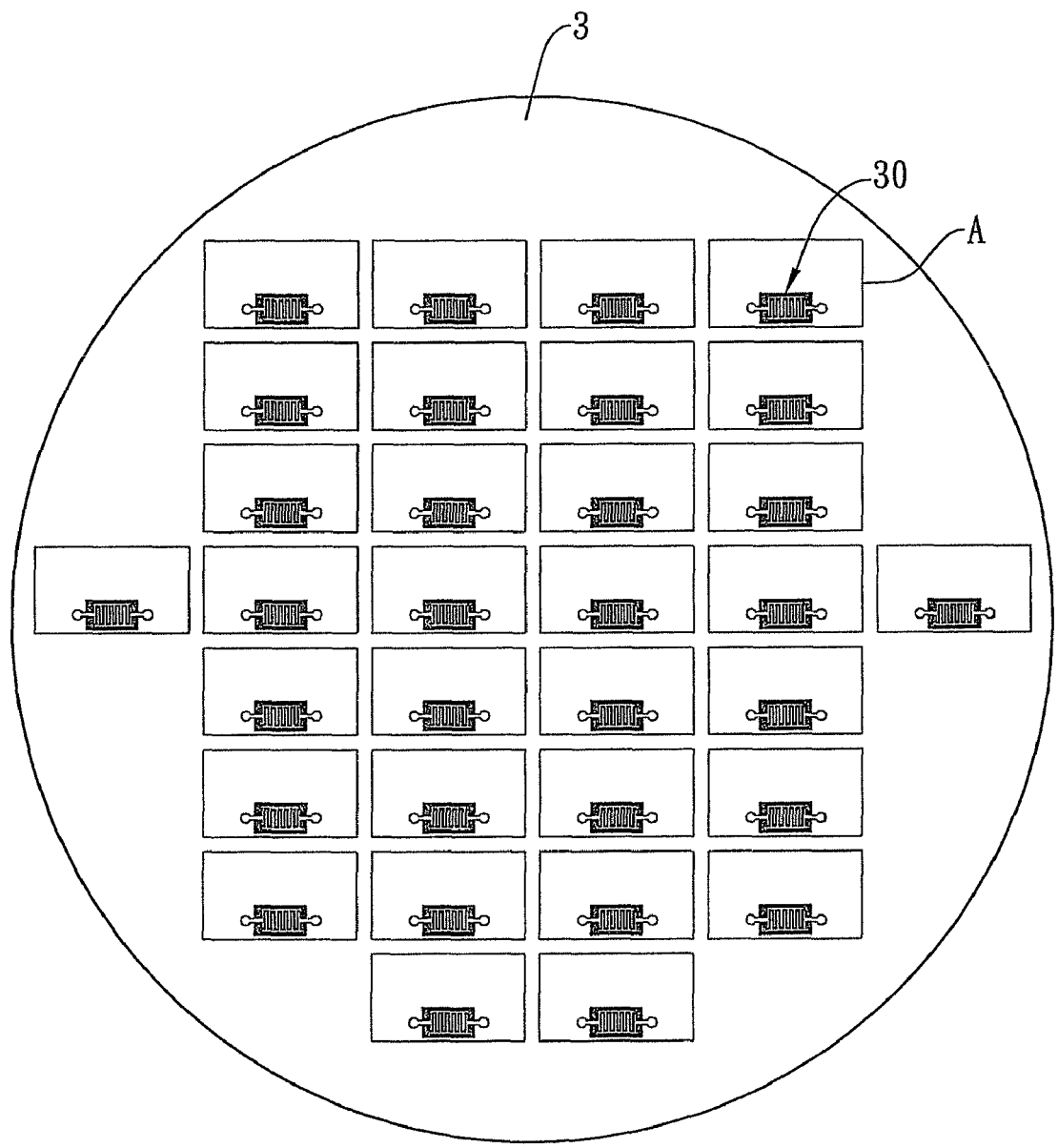
FIG. 3 is a schematic front view of a wafer including multiple capacitor devices of the present invention, illustrating that capacitor devices of the present invention can be fabricated on a wafer using a wafer-level process.
Figure 4A:
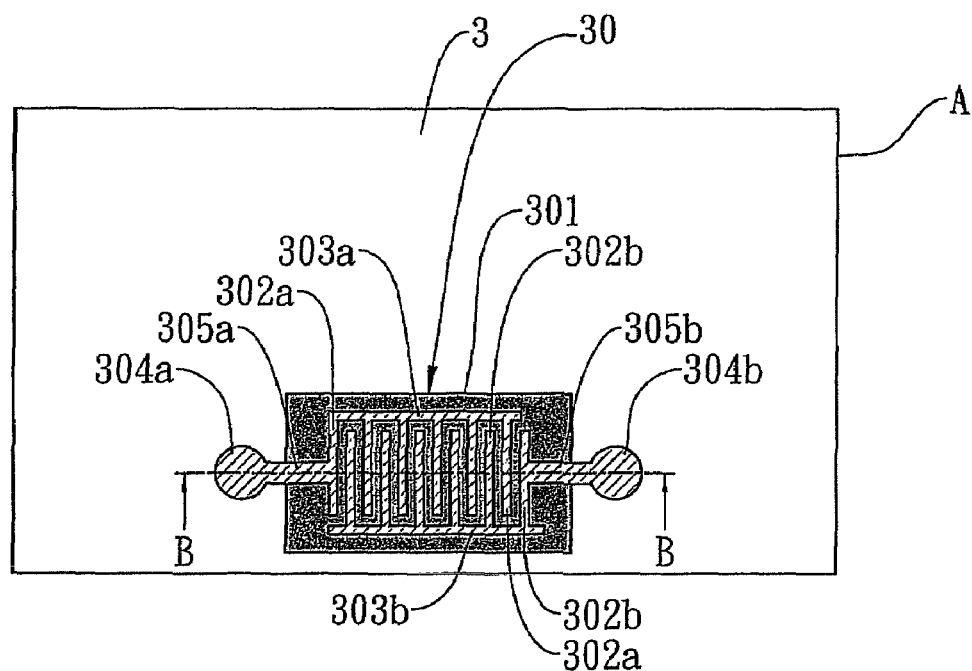
FIG. 4A is a schematic front view illustrating a capacitor device of the present invention.
Figure 4B:
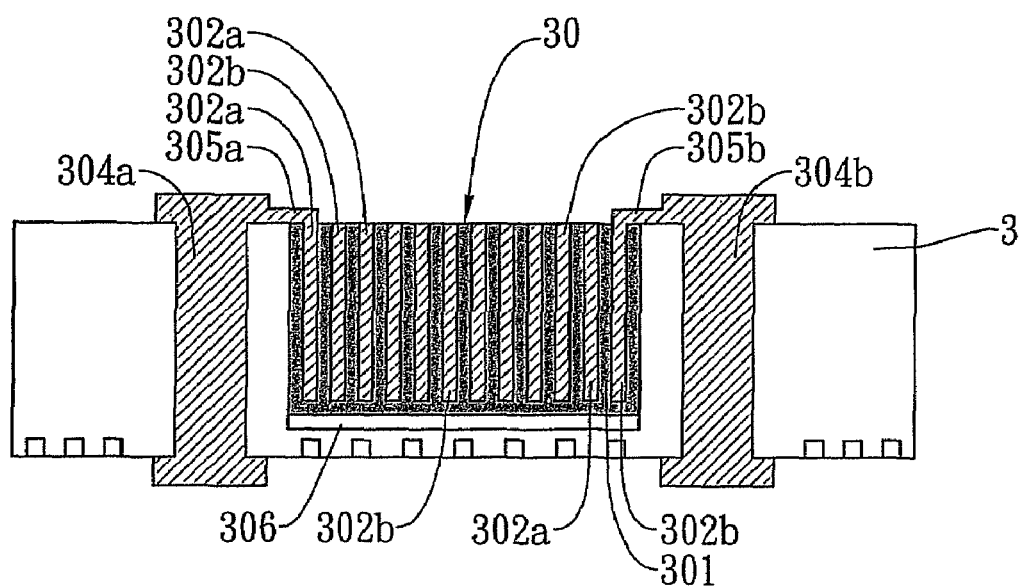
FIG. 4B is a schematic cross-sectional view taken along line B-B of the capacitor device in FIG. 4A.

The present invention provides a capacitor device that can be directly fabricated on a wafer using a wafer-level, low temperature process. As used herein, the phrase "low temperature" generally means the temperature that the IC device on the wafer can undergo during the fabrication process, such as below 400° C. FIG. 3 is a schematic front view of multiple capacitor devices 30 of the present invention, which are fabricated on a wafer 3 using a wafer-level process. FIG. 4A is a schematic front view illustrating single capacitor device 30 of the present invention, and FIG. 4B is a schematic cross-sectional view taken along line B-B of the capacitor device 30 in FIG. 4A. Referring to FIG. 4A, the capacitor device 30 is fabricated at a predetermined region A on the wafer 3 so that the capacitor device 30 can be integrated with an active device (not shown) formed on the wafer 3. The capacitor device 30 comprises a bulk dielectric material 301 having a dielectric constant greater than 1000, a plurality of first electrode plates 302a, a first common conducting line 303a, a plurality of second electrode plates 302b, and a second common conducting line 303b. The bulk dielectric material 301 is positioned at the predetermined region A on the wafer 3. The present invention uses an adhesive layer 306 to bond the bulk dielectric material 301 into the wafer 3 at the predetermined region A (as shown in FIG. 4B). The plurality of first electrode plates 302a extend vertically from one surface of the wafer 3 into the bulk dielectric material 301, with each first electrode plate 302a being disposed parallel to one another. The first common conducting line 303a is formed on the surface of the wafer 3 and electrically connects the first electrode plates 302a to a common voltage terminal (not shown). The plurality of second electrode plates 302b extend vertically from the surface of the wafer 3 into the bulk dielectric material 301 and interdigitate parallel to the first electrode plates 302a. The second common conducting line 303b is formed opposite to the first common conducting line 303a on the surface of the wafer 3 and electrically connects the second electrode plates 302b to another common voltage terminal (not shown), which has an electrical conductivity opposite to the common voltage terminal connecting to the first electrode plates 302a. Referring to FIGS. 4A and 4B, the capacitor device 30 further comprises a first vertical conducting line 304a, a first parallel conducting line 305a, a second vertical conducting line 304b, and a second parallel conducting line 305b. The first vertical conducting line 304a extends through the wafer 3. The first parallel conducting line 305a is formed on the surface of the wafer 3 and electrically connects the first vertical conducting line 304a with a first electrode plate 302a which is closest to the outside. Formed opposite to the first vertical conducting line 304a, the second vertical conducting line 304b extends through the wafer 3 and the second parallel conducting line 305b, which is formed on the surface of the wafer 3 and electrically connects the second vertical conducting line 304b with a second electrode plate 302b which is closest to the outside.

A capacitor device 30 of the present invention can be fabricated on the active side or back side of the wafer 3. In other words, the capacitor device 30 can be fabricated on either the same or opposite side where the active devices are formed. Referring to FIG. 4A, since the capacitor device 30 of the present invention comprises a plurality of vertical electrode plates 302a, 302b and the bulk dielectric material 301 having a dielectric constant greater than 1000, the capacitance of the capacitor device 30 can be effectively increased. The present invention can further increase the capacitance of the capacitor device 30 by reducing the distance between the electrode plates 302a and 302b. In addition, the design of the first vertical conducting line 304a and second vertical conducting line 304b within the capacitor device 30 facilitates the vertical stacking of multiple capacitor devices 30. And by means of the multiple first vertical conducting lines 304a and second vertical conducting lines 304b, further vertical conducting lines can be formed. Therefore, with the present invention, a capacitor device having a vertically stacked structure can also be fabricated on the wafer 3.

Figure 5A:
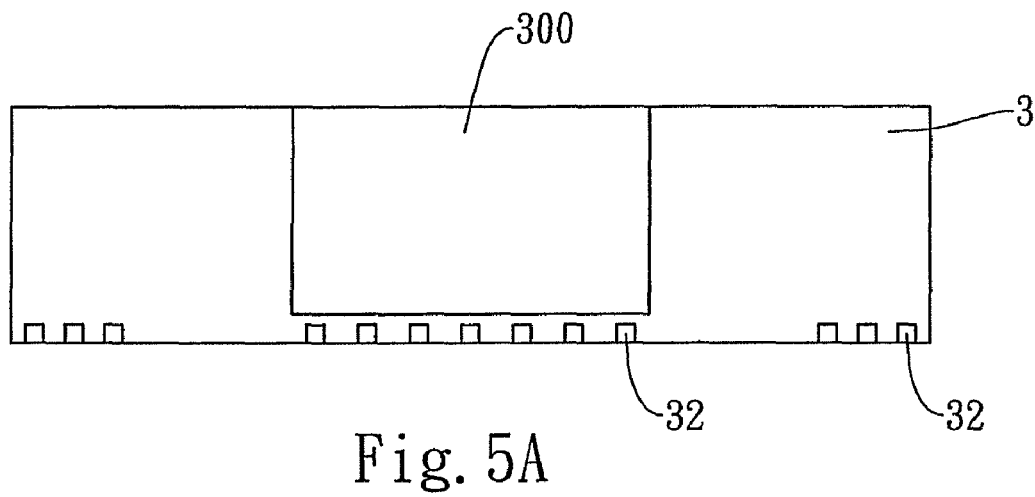
FIGS. 5A through 5F are schematic cross-sectional views representing process steps in manufacturing a capacitor device according to a first embodiment of the present invention.
Figure 5B:
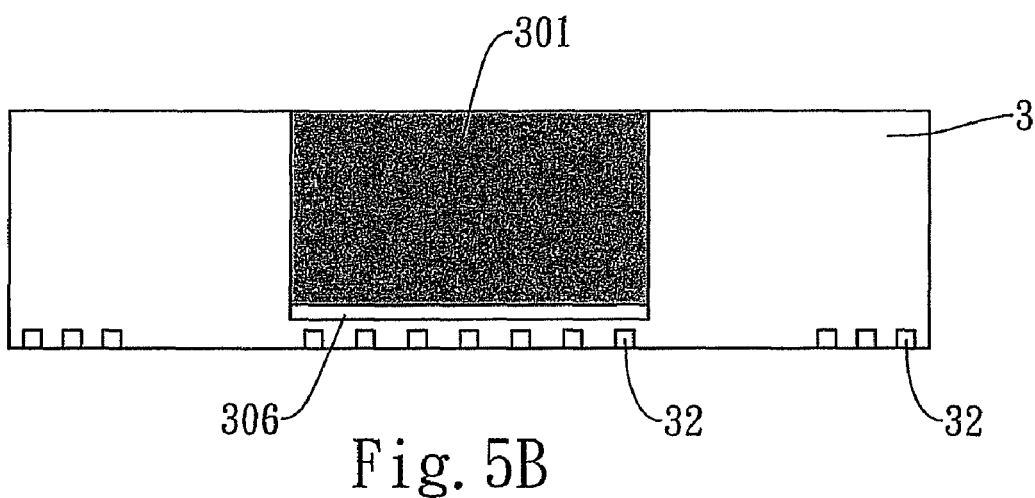
Figure 5C:
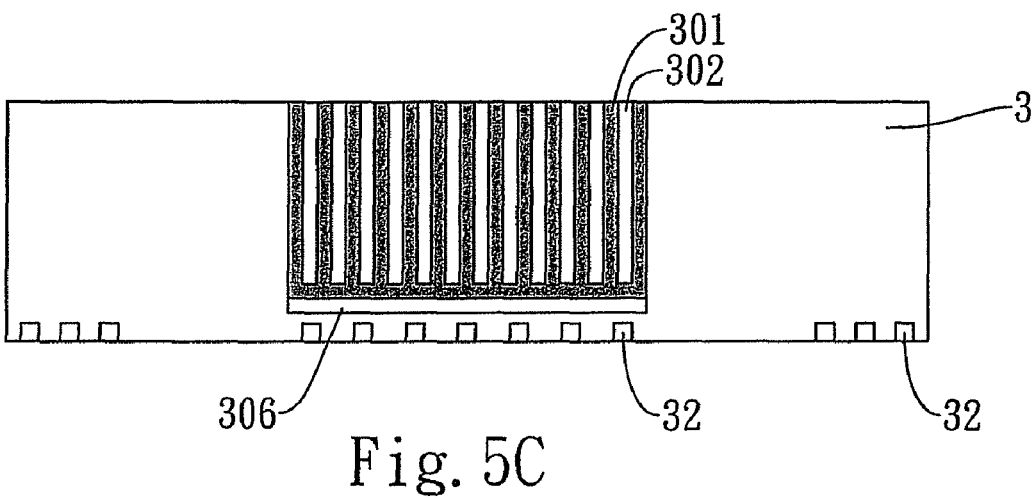
Figure 5D:
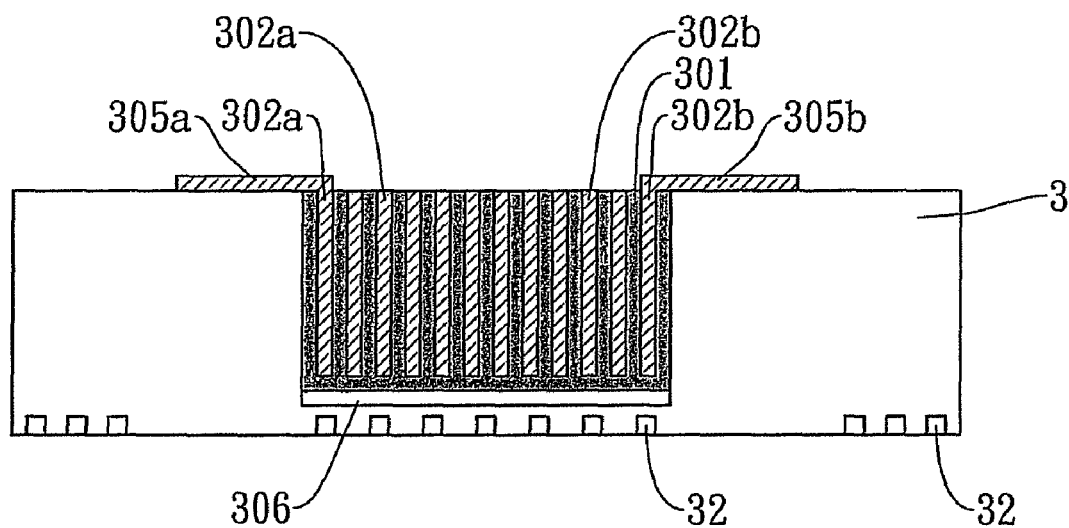
Figure 5E:
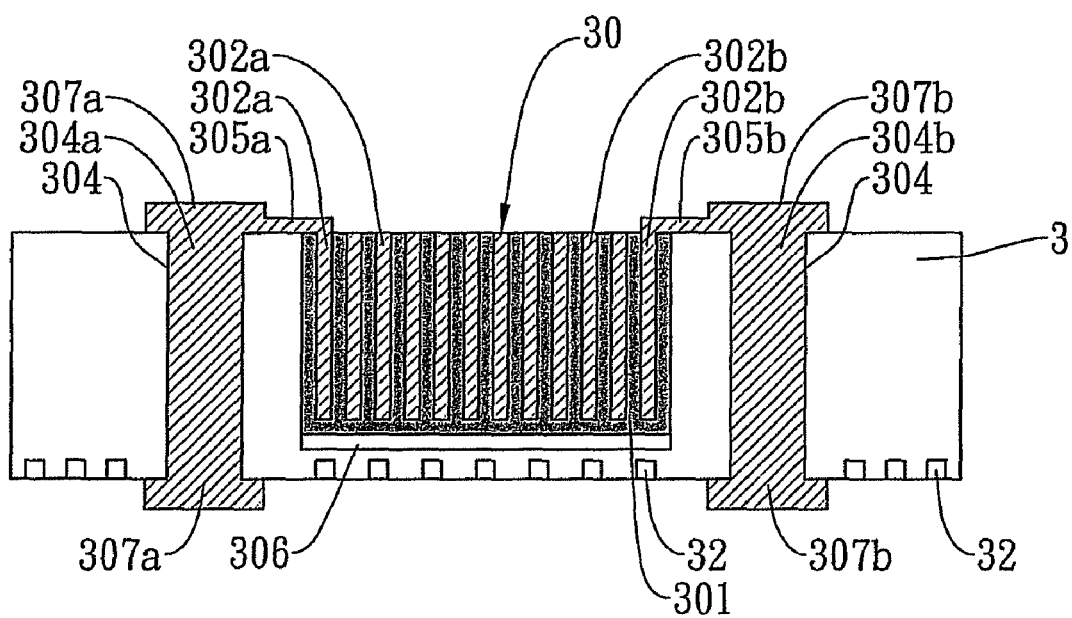
Figure 5F:
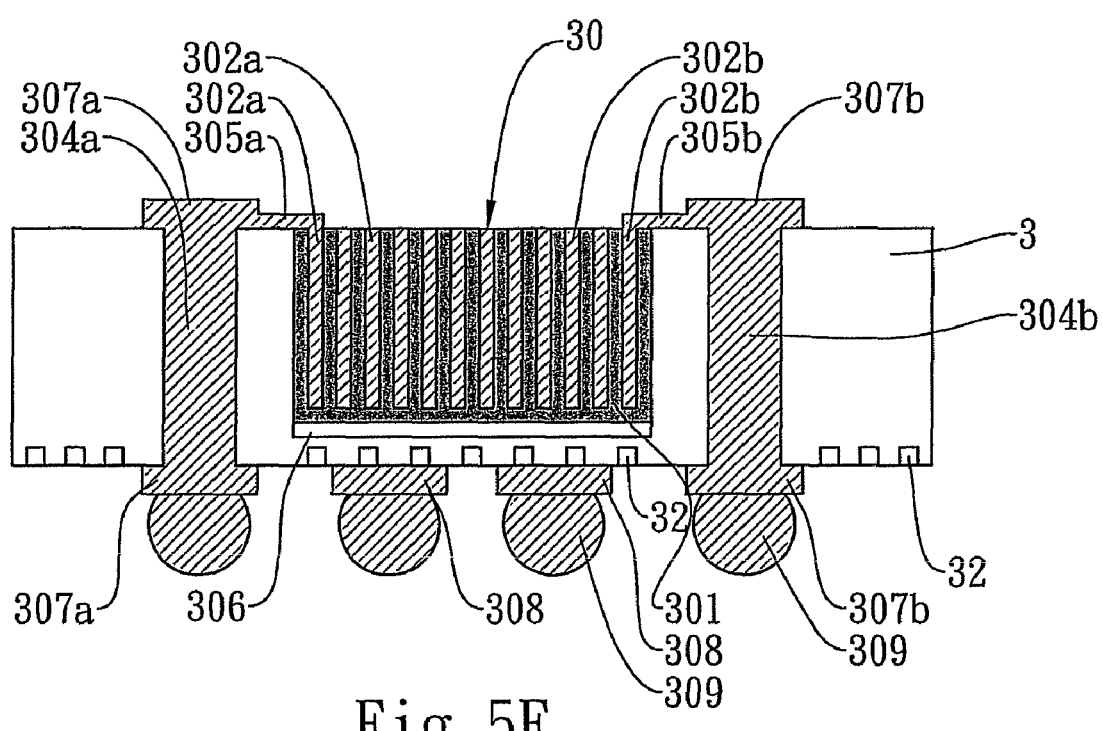

The method for manufacturing the capacitor device 30 of the present invention will now be described in detail with reference to preferred embodiments and accompanying drawings. FIGS. 5A through 5E are schematic cross-sectional views respectively corresponding to various process steps in manufacturing the capacitor device 30 according to a first embodiment of the present invention. Referring to FIG. 5A, a semiconductor substrate (wafer) 3 is provided first in the first embodiment; the semiconductor substrate 3 comprises at least one active device 32 formed on a first surface (defined as the active surface of the semiconductor substrate 3). Then, at least one cavity 300 is formed at a predetermined region of the semiconductor substrate 3, opposite to the active devices 32. That is, the cavity 300 extends from a second surface, which is opposite to the first surface, into the semiconductor substrate 3. In the first embodiment of the present invention, the cavity 300 can be formed in the semiconductor substrate 3 by dry-etching or ICP (Inductively Coupled Plasma) etching techniques. The cavity 300 as shown in FIG. 5A is formed at the opposite side of the active devices 32; however, the cavity 300 and the active devices 32 can also be formed at the same side of the semiconductor substrate 3. Referring to FIG. 5B, a bulk dielectric material 301 having a high dielectric constant, e.g., greater than 1000, is filled into the cavity 300. The bulk dielectric material 301 is bonded to the semiconductor substrate 3 by means of an adhesive layer 306. The bulk dielectric material 301 to be filled into the cavity 300 may be BaTiO$_3$ that has been sintered at high temperatures with a dielectric constant ranging from thousands to tens of thousands. Referring to FIG. 5C, a plurality of parallel plate-shaped holes 302 extending vertically through the bulk dielectric material 301 are formed; the plate-shaped holes 302 include a set of first plate-shaped holes 302 and a set of second plate-shaped holes 302 (with reference to FIG. 4A). The first plate-shaped holes 302 and the second plate-shaped holes 302 are parallel to one another, disposed interdigitatedly within the bulk dielectric material 301. The first plate-shaped holes 302 extend toward one side, and the second plate-shaped holes 302 extend toward the opposite side of the bulk dielectric material 301. In the present invention, the plate-shaped holes 302 within the bulk dielectric material 301 can be formed by techniques such as ICP etching or laser drilling. Referring to FIG. 5D, a conductive material, such as Al, Cu, W or polycrystalline silicon, is then deposited into the first and second plate-shaped holes 302 to form a plurality of first electrode plates 302a and second electrode plates 302b respectively. The plurality of first electrode plates 302a and second electrode plates 302b are parallel to one another, disposed interdigitatedly within the bulk dielectric material 301. In this step, the present invention forms a conducting line pattern on the second surface of the semiconductor substrate 3 at the same time. Referring to FIGS. 4A and 5D, the conducting line pattern includes a first common conducting line 303a, a second common conducting line 303b, a first parallel conducting line 305a, and a second parallel conducting line 305b. Respectively, the first common conducting line 303a connects the first electrode plates 302a, and the second common conducting line 303b connects the second electrode plates 302b. Moreover, the first parallel conducting line 305a connects with a first electrode plate 302a which is closest to the outside, and the second parallel conducting line 305b connects with a second electrode plate 302b which is closest to the outside. So far the main structure of the capacitor device 30 of the present invention has been fabricated, which is a multi-layered metal-insulator-metal (MIM) capacitor structure. Referring to FIG. 5E, a pair of vertical through-vias 304 is formed respectively besides the opposite sides of the bulk dielectric material 301 using the through-silicon-via (TSV) technology. Respectively, the vertical through-vias 304 extend vertically through the first parallel conducting line 305a, the semiconductor substrate 3, and the second parallel conducting line 305b. Then, a conductive material the same as that of the first and second parallel conducting lines 305a and 305b are filled into the pair of vertical through-vias 304 to form a first vertical conducting line 304a and a second vertical conducting line 304b respectively. As such, the first parallel conducting line 305a connects the first electrode plate 302a closest to the outside and the first vertical conducting line 304a; the second parallel conducting line 305b connects the second electrode plate 302b closest to the outside and the second vertical conducting line 304b. In this step, moreover, a pair of first electrical contacts 307a is formed at both ends of the first vertical conducting line 304a, and a pair of second electrical contacts 307b is formed at both ends of the second vertical conducting line 304b. Referring to FIG. 5F, a plurality of conductive solder pads 308 are formed under the first surface of the semiconductor substrate 3. A plurality of conductive bumps, such as solder balls 309, are further formed, respectively bonded to the first electrical contact 307a, the second electrical contact 307b, and the solder pads 308 under the first surface of the semiconductor substrate 3.

Figure 6:
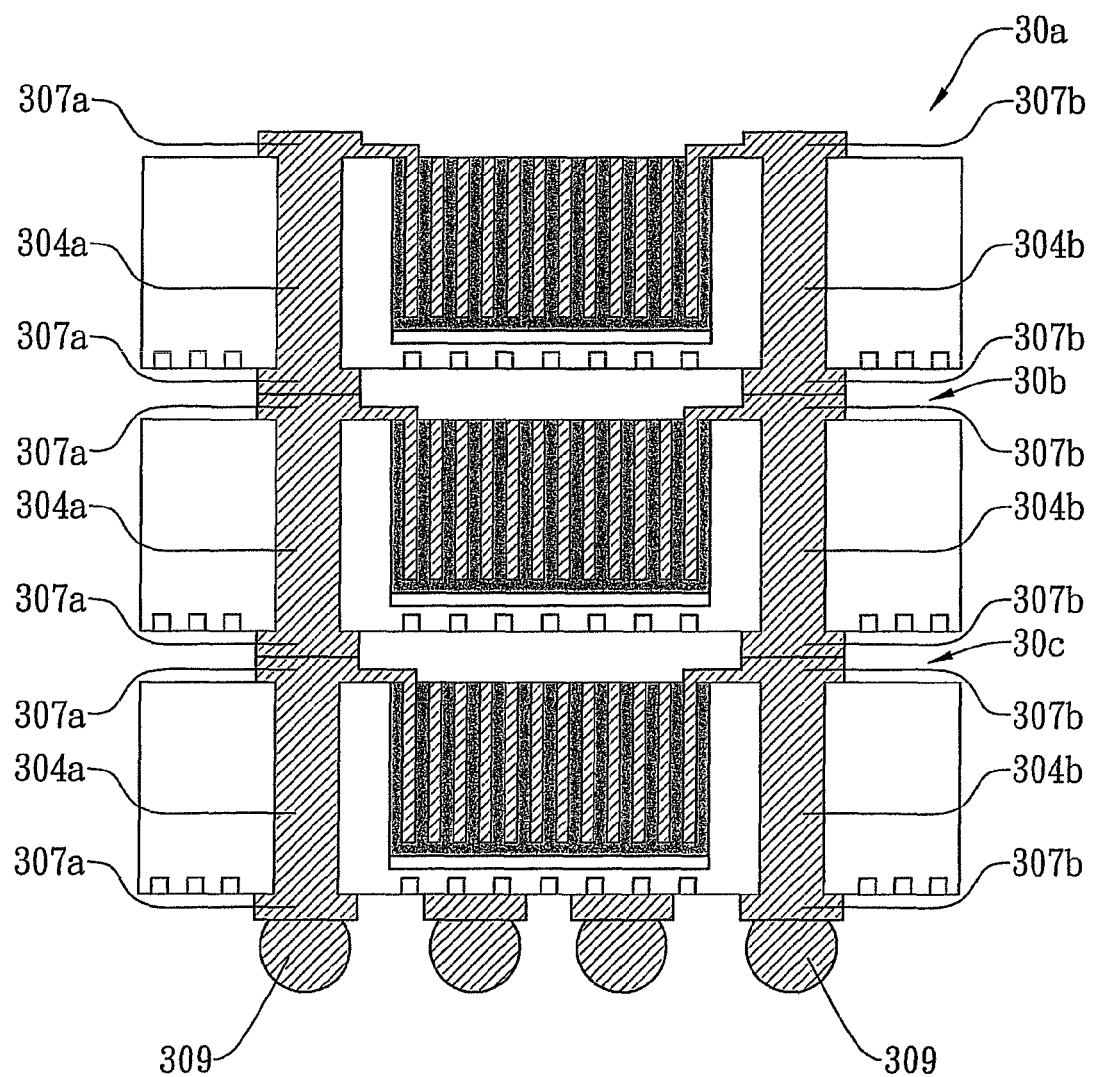
FIG. 6 is a cross-sectional view illustrating a capacitor device having a vertically stacked structure.

Because of the particular design of the first and second vertical conducting lines 304a, 304b of the capacitor device 30, the present invention allows vertical stacking of multiple capacitor devices 30. Referring to FIG. 6, multiple capacitor devices 30a, 30b and 30c, which have been fabricated as shown in FIG. 5E, can be vertically stacked so that the first vertical conducting lines 304a and the second vertical conducting lines 304b respectively connect and align. The vertical conducting communication of the capacitor devices 30a, 30b and 30c is thus formed, and electrical connection with external circuitry can be made through the solder balls 309 under the capacitor device 30. Consequently, a capacitor device having the vertically stacked structure according to the present invention is provided.

In the present invention, the bulk dielectric material 301 can be obtained by sintering a material that has a high dielectric constant, e.g. greater than 1000, at high temperatures first. After that, the formed bulk dielectric material 301 is bonded within the pre-selected cavity 300 of the semiconductor substrate 3 by the adhesive layer 306. Then, the capacitor device 30 is formed on the semiconductor substrate 3 using a low temperature process. The capacitor device 30 of the present invention comprises multiple vertical electrode plates and a material having a high dielectric constant, and therefore, the capacitance of the capacitor device 30 is increased. The capacitance can be further increased by adjusting the number of vertical electrode plates, or by reducing the distance between every two vertical electrode plates. Moreover, since the method of the present invention fabricates the capacitor device 30 directly on the semiconductor substrate 3 where the active devices 32 are also formed, the capacitor device 30 and the active devices 32 can be integrated on the semiconductor substrate 3. Such integration allows the reduction of assembly cost. And by reducing the distance between the capacitor device 30 and the active devices 32, the parasitic inductance is reduced, which further allows the noise of active devices 32 to be reduced.

Figure 7A:
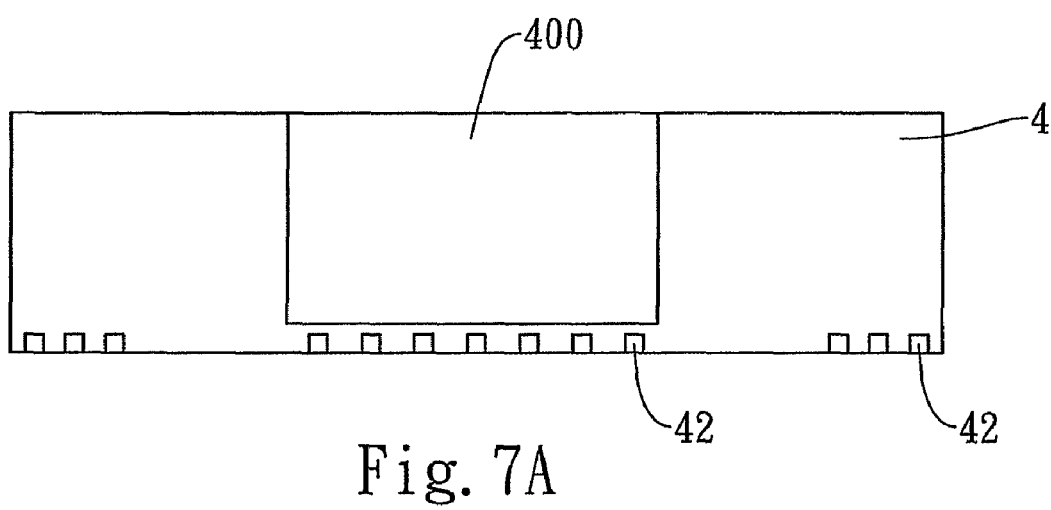
FIGS. 7A through 7F are schematic cross-sectional views representing process steps in manufacturing a capacitor device according to a second embodiment of the present invention.
Figure 7B:
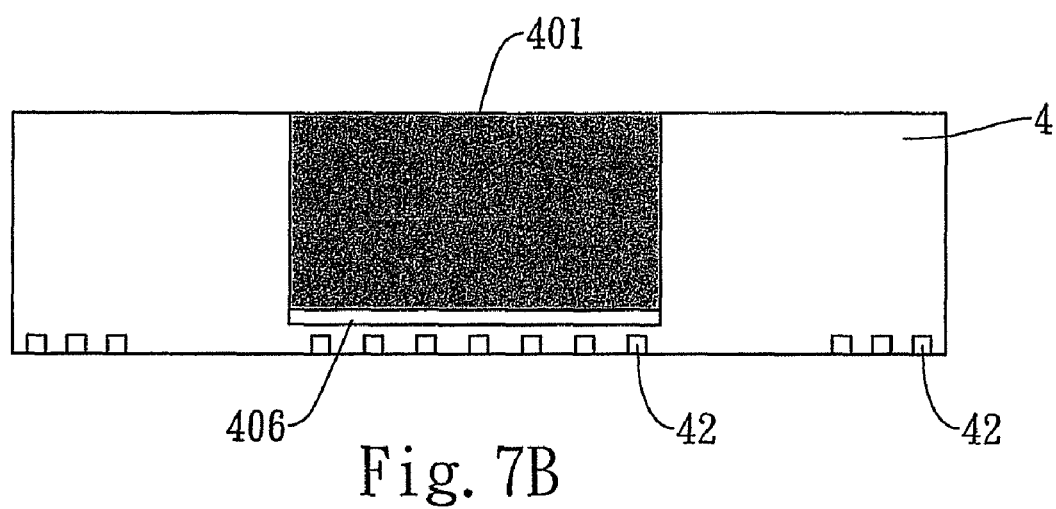
Figure 7C:
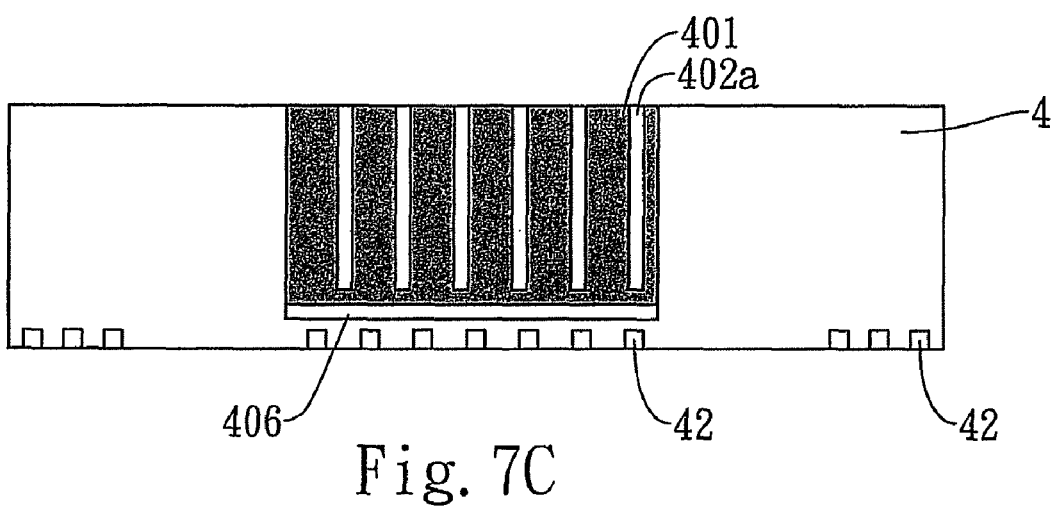
Figure 7D:
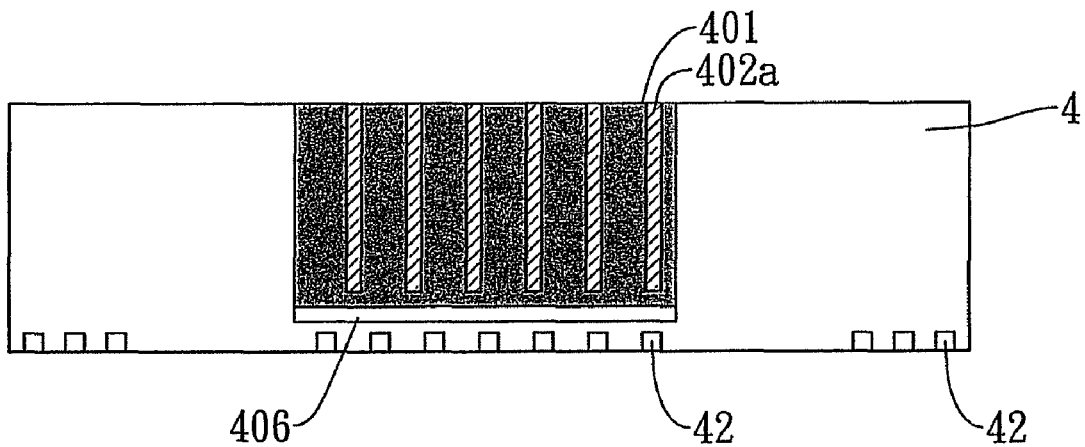
Figure 7E:
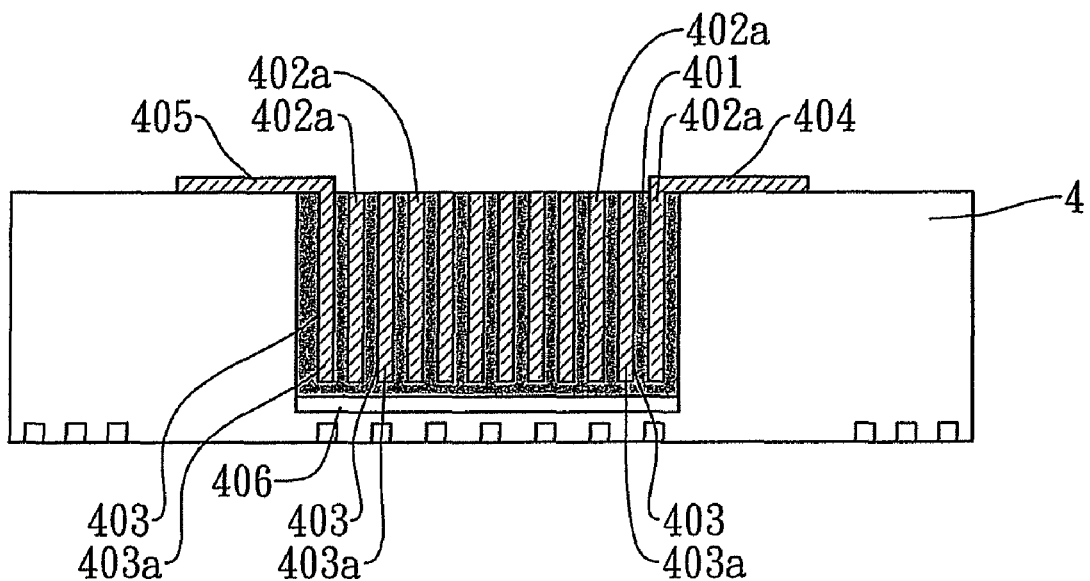
Figure 7F:
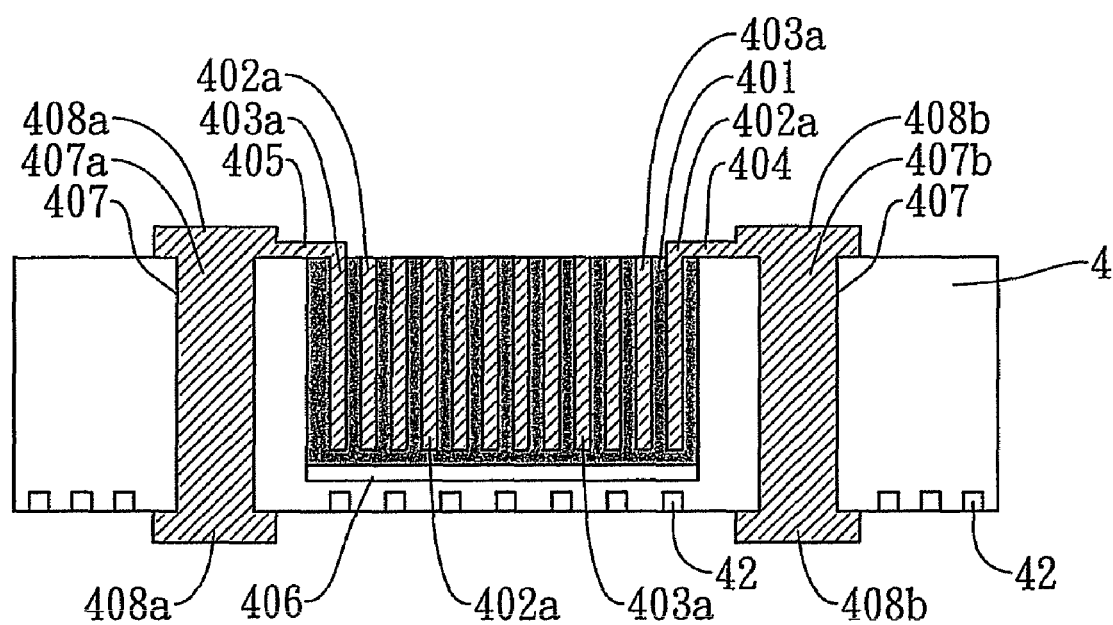

FIGS. 7A through 7F are schematic cross-sectional views respectively corresponding to process steps in manufacturing the capacitor device 30 according to a second embodiment of the present invention. Referring to FIG. 7A, a semiconductor substrate 4 is provided first; the semiconductor substrate 4 comprises at least one active device 42 formed on a first surface Then, at least one cavity 400 is formed at a predetermined region of the semiconductor substrate 4, opposite to the active devices 42. That is, the cavity 400 extends from a second surface, which is opposite to the first surface, into the semiconductor substrate 4. In the second embodiment of the present invention, the cavity 400 can be formed in the semiconductor substrate 4 by dry-etching or ICP etching techniques. The cavity 400 as shown in FIG. 7A is formed at the opposite side of the active devices 42; however, the cavity 400 and the active devices 42 can also be formed at the same side of the semiconductor substrate 4. Referring to FIG. 7B, a bulk dielectric material 401 having a high dielectric constant, e.g., greater than 1000, is filled into the cavity 400. The bulk dielectric material 401 is bonded to the semiconductor substrate 4 by means of an adhesive layer 406. The bulk dielectric material 401 to be filled into the cavity 400 may be $BaTiO_3$ that has been sintered at high temperatures with a dielectric constant ranging from thousands to tens of thousands. Referring to FIG. 7C, a plurality of first plate-shaped holes 402, which are disposed parallel to one another and extending vertically through the bulk dielectric material 401, are formed. The plurality of first plate-shaped holes 402 extend toward one side of the bulk dielectric material 401 (not shown in FIG. 7C). Referring to FIG. 7D, a conductive material, such as Al, Cu, W or polycrystalline silicon, is then deposited into the first plate-shaped holes 402 to form a plurality of first electrode plates 402a. Referring to FIG. 7E, a plurality of second plate-shaped holes 403, which extend vertically through the bulk dielectric material 401 and interdigitate with the first electrode plates 402a, are formed. The plurality of second plate-shaped holes 403 extend toward the opposite side of the bulk dielectric material 401 (not shown in FIG. 7E). In this step, because the conductive material that has been deposited into the first plate-shaped holes 402 to reinforce the bulk dielectric material 401, the second plate-shaped holes 403 can be formed more easily. Next, a conductive material the same as that of the first electrode plates 402a is deposited into the second plate-shaped holes 403 using electroplating, PVD or CVD techniques, so that a plurality of second electrode plates 403a are formed. The first electrode plates 402a and the second electrode plates 403a interdigitate parallel with each other within the bulk dielectric material 401. In this step, a conducting line pattern is also formed on the second surface of the semiconductor substrate 4 at the same time. Referring to FIG. 4A, the conducting line pattern includes a first common conducting line (same with the first common conducting line 303a shown in FIG. 4A), a second common conducting line (same with the second common conducting line 303b shown in FIG. 4A), a first parallel conducting line 404, and a second parallel conducting line 405. Respectively, the first common conducting line connects the first electrode plates 402a, and the second common conducting line connects the second electrode plates 403a. Moreover, the first parallel conducting line 404 connects with a first electrode plate 402a which is closest to the outside, and the second parallel conducting line 405 connects with a second electrode plate 403a which is closest to the outside. Referring to FIG. 7F, a pair of vertical through-vias 407 is formed besides the two opposite sides of the bulk dielectric material 401 using the through-silicon-via (TSV) technology. The vertical through-vias 407 respectively extend vertically through the first parallel conducting line 404, the second parallel conducting line 405 and the semiconductor substrate 4. Then, a conductive material the same as those of the first electrode plates 402a and the second electrode plate 403a is deposited into the pair of vertical through-vias 407 using electroplating, PVD or CVD techniques to form a first vertical conducting line 407a and a second vertical conducting line 407b respectively. As such, the first parallel conducting line 404 connects the first electrode plate 402a closest to the outside and the first vertical conducting line 407a; the second parallel conducting line 405 connects the second electrode plate 403b closest to the outside and the second vertical conducting line 407b. In this step, moreover, a pair of first electrical contacts 408a is formed at both ends of the first vertical conducting line 407a, and a pair of second electrical contacts 408 are formed at both ends of the second vertical conducting line 407b. The main structure of the capacitor device of the present invention that includes a vertical electrical connection is thus completed.

The method for manufacturing a capacitor device in the second embodiment forms holes and fills them respectively in two stages. By first forming the first plate-shaped holes within the bulk dielectric material 401 and filling the holes with a conductive material, the bulk dielectric material 401 can have been reinforced. Next, a plurality of the second plate-shaped holes is formed within the bulk dielectric material 401, interdigitating with the first plate-shaped holes. Then, the second plate-shaped holes are filled with a conductive material. With the method applied in the second embodiment of the present invention, it is possible to fabricate a high-capacitance capacitor device having more electrode plates with a smaller spacing between every two electrode plates.

While this invention has been described by way of examples and in terms of preferred embodiments, it is to be understood that this invention is not limited hereto, and that various changes, substitutions, and alterations can be made herein without departing from the spirit and scope of this invention as defined by the appended claims.

What is claimed is:

1. A capacitor device, comprising:
a semiconductor substrate having at least one active device;
at least one capacitor device formed in a predetermined region of said semiconductor substrate, said capacitor device comprising:
a bulk dielectric material positioned in said predetermined region of said semiconductor substrate;
a plurality of first electrode plates extending vertically from one surface of said semiconductor substrate into said bulk dielectric material, each first electrode plate being disposed parallel to one another;
a first common conducting line formed on said surface of said semiconductor substrate and electrically connecting said first electrode plates;
a plurality of second electrode plates extending vertically from said surface of said semiconductor substrate into said bulk dielectric material and interdigitating parallel to said first electrode plates;
a second common conducting line formed opposite to said first common conducting line on said surface of said semiconductor substrate and electrically connecting said second electrode plates; and
a first vertical conducting line, a first parallel conducting line, a second vertical conducting line and a second parallel conducting line, said first vertical conducting line extending through said semiconductor substrate and said first parallel conducting line, which is formed on said surface of said semiconductor substrate and electrically connecting said first vertical conducting line with a first electrode plate closest to the outside; and said second vertical conducting line formed opposite to said first vertical conducting line and extending through said semiconductor substrate and said second parallel conducting line, which is formed on said surface of said semiconductor substrate and electrically connecting said second vertical conducting line with a second electrode plate closest to the outside.

2. A capacitor device, comprising:
a semiconductor substrate having at least one active device;
at least one capacitor device formed in a predetermined region of said semiconductor substrate, said capacitor device comprising:
a bulk dielectric material positioned in said predetermined region of said semiconductor substrate;
a plurality of first electrode plates extending vertically from one surface of said semiconductor substrate into said bulk dielectric material, each first electrode plate being disposed parallel to one another;
a first common conducting line formed on said surface of said semiconductor substrate and electrically connecting said first electrode plates;
a plurality of second electrode plates extending vertically from said surface of said semiconductor substrate into said bulk dielectric material and interdigitating parallel to said first electrode plates;
a second common conducting line formed opposite to said first common conducting line on said surface of said semiconductor substrate and electrically connecting said second electrode plates; and
an adhesive layer bonded between said bulk dielectric material and said semiconductor substrate.

3. The capacitor device of claim 1, comprising an adhesive layer bonded between said bulk dielectric material and said semiconductor substrate.

4. The capacitor device of claim 1, further comprising at least one capacitor device of claim 2 stacked upon said surface of said capacitor device having high capacitance and high integration, wherein said first vertical conducting lines of capacitor devices and said second vertical conducting lines of capacitor devices respectively connect and align.

5. The capacitor device of claim 4, further comprising a plurality of conductive bumps formed under another surface of the capacitor device at the bottom and electrically contacting said first vertical conducting line and said second vertical conducting line respectively.

6. The capacitor device of claim 1, wherein said bulk dielectric material has a dielectric constant greater than 1000.

7. The capacitor device of claim 4, wherein said bulk dielectric materials of said capacitor devices have a dielectric constant greater than 1000.

* * * * *